United States Patent
Fukuda et al.

(10) Patent No.: US 6,812,102 B2
(45) Date of Patent: Nov. 2, 2004

(54) SEMICONDUCTOR DEVICE MANUFACTURING METHOD

(75) Inventors: Kenji Fukuda, Ibaraki (JP); Kazuo Arai, Ibaraki (JP); Junji Senzaki, Ibaraki (JP); Shinsuke Harada, Ibaraki (JP); Ryoji Kosugi, Ibaraki (JP); Kazuhiro Adachi, Ibaraki (JP); Seiji Suzuki, Moriguchi (JP)

(73) Assignees: National Institute of Advanced Industrial Science and Technology, Tokyo (JP); Japan Science and Technology Corporation, Kawaguchi (JP); Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/466,311

(22) PCT Filed: Jan. 24, 2002

(86) PCT No.: PCT/JP02/00512

§ 371 (c)(1),
(2), (4) Date: Dec. 30, 2003

(87) PCT Pub. No.: WO02/059980

PCT Pub. Date: Aug. 1, 2002

(65) Prior Publication Data

US 2004/0087093 A1 May 6, 2004

(30) Foreign Application Priority Data

Jan. 25, 2001 (JP) ........................................ 2001-017680

(51) Int. Cl.$^7$ ..................... H01L 21/336; H01L 21/00; H01L 21/8238
(52) U.S. Cl. ........................ 438/298; 438/75; 438/217
(58) Field of Search ......................... 438/298, 75, 76, 438/217, 276, 362, 526

(56) References Cited

U.S. PATENT DOCUMENTS

| | | | | |
|---|---|---|---|---|
| 4,160,987 A | * | 7/1979 | Dennard et al. | 438/298 |
| 4,396,438 A | * | 8/1983 | Goodman | 438/75 |
| 4,658,278 A | * | 4/1987 | Elabd et al. | 257/222 |
| 4,866,497 A | * | 9/1989 | Kosonocky | 257/222 |
| 5,965,919 A | * | 10/1999 | Yoo | 257/351 |
| 6,084,247 A | * | 7/2000 | Yamazaki et al. | 257/58 |
| 6,107,126 A | * | 8/2000 | Wu | 438/217 |
| 6,617,653 B1 | * | 9/2003 | Yokogawa et al. | 257/379 |

FOREIGN PATENT DOCUMENTS

JP       8-186179       7/1996

OTHER PUBLICATIONS

William E. Wagner et al.: "characterization of silicon carbide (Sic) epitaxial channel MOSFETs" IEEE Transactions on Electron Devices, vol. 47, No. 11, pp. 2214–2220 11/00.

(List continued on next page.)

*Primary Examiner*—John F. Niebling
*Assistant Examiner*—Walter L. Lindsay, Jr.
(74) *Attorney, Agent, or Firm*—Oblon, Spivak, McClelland, Maier & Neustadt, P.C.

(57) ABSTRACT

In a semiconductor device using a silicon carbide substrate (1), the object of the present invention is to provide a method of manufacturing a semiconductor device that is a buried channel region type transistor having hot-carrier resistance, high punch-through resistance and high channel mobility. This is achieved by using a method of manufacturing a buried channel type transistor using a P-type silicon carbide substrate that includes a step of forming a buried channel region, a source region and a drain region, a step of forming a gate insulation layer after the step of forming the buried channel region, source region and drain region, and a step of exposing the gate insulation layer to an atmosphere containing water vapor at a temperature of 500° C. or more after the step of forming the gate insulation layer. The gate insulation layer is formed by a thermal oxidation method using dry oxygen.

19 Claims, 5 Drawing Sheets

OTHER PUBLICATIONS

Lori A. Lipkin et al.: "Insulator Investigation on SiC for improved reliability" IEEE Transactions on Electron Devices, vol. 46, No. 3, pp. 525–532 03/99.

Man Pio Lam et al.: "Punchthrough behavior in short channel NMOS and PMOS 6H–silicon carbide transistors at elevated temperatures" IEEE Transactions on Components and Packaging Technology, vol. 22, No. 3, pp. 433–438, 09/99.

Lori A. Lipkin et al.: "SiC devices with ONO stacked dielectrics" Materials Science Forum vols. 338 to 242, Silicon Carbide and Related Materials, pp. 1093–1096 12/99.

Katsunori Ueno et al.: "Counter–doped MOSFET's of 4H–SiC" IEEE Electron Device Letters, vol. 20, No. 12, pp. 624–626 Dec. 1999.

Ulrich Schmid et al.: "High temperature performance of NMOS integrated inverters and ring oscillators in 6H–SiC" IEEE Transactions on Electron Devices, vol. 47, No. 4, pp. 687–691 04/00.

Scott T. Sheppard et al.: "Characteristics of inversion–channel and buried–channel MOS devices in 6H–SiC" IEEE Transactions on Electron Devices, vol. 41, No. 7, pp. 1257–1264, 07/94.

* cited by examiner (a)
ION IMPLANTATION FOR
N-REGION FORMATION (b)
ION IMPLANTATION FOR
SOURCE AND DRAIN FORMATION (c)

(d)

SEMICONDUCTOR DEVICE MANUFACTURING METHOD

TECHNICAL FIELD

This invention relates to a method of manufacturing a metal-insulator-semiconductor (MIS) field-effect transistor that is fabricated on a silicon carbide substrate in which the crystal surface orientation of the substrate is prescribed and the impurity diffusion layer is optimized, particularly to a method of manufacturing a semiconductor device in which the method of forming a gate insulation layer and the following heat treatment are contrived.

BACKGROUND ART

A number of inventions have already been disclosed relating to a method of oxidizing a silicon carbide substrate and the following heat treatment method, and to an MIS field-effect transistor having a buried channel region.

For example, U.S. Pat. No. 5,864,157 describes a structure that, in a flash memory having dual gates, uses a P-type electrode for the lower gate and an N-type impurity for the buried channel region. However, this description relates to a flash memory having dual gates, which is different from the structure of the present invention. Also, there is no description concerning the concentration of the P-type polysilicon electrode and the impurity concentration of the buried channel region, and the relationship between the depth of the source region or drain region and the depth of the channel region.

In JP-A HEI 8-186179, there is described a structure, in an N-channel transistor having an LDD structure, that uses a P-type electrode for the gate electrode and an N-type impurity for the buried channel region. However, in this JP-A HEI 8-186179, there is no description concerning the impurity concentration of the P-type polysilicon electrode and the relationship between the depth of the source region or drain region and the depth of the channel region.

Also, JP-A HEI 7-131016 describes an MIS field-effect transistor structure characterized by the transistor channel formation surface being parallel to the (1, 1, ⁻2, 0) surface of the hexagonal silicon carbide single-crystal substrate. However, this JP-A HEI 7-131016 does not describe anything relating to a buried channel region type MIS field-effect transistor that uses a P-type electrode for the gate electrode.

With respect to a method of oxidizing a silicon-carbide substrate, U.S. Pat. No. 5,972,801 describes a method that, following formation of the gate oxide layer, includes exposing the gate oxide layer to an atmosphere containing water vapor at a temperature of 600° C. to 1000° C., but this process is carried out under conditions whereby there is no increase in the thickness of the gate oxide layer of the silicon carbide substrate that is thus further oxidized. This differs from the present invention, in that in the present invention, the silicon carbide substrate is slightly oxidized and the thickness of the gate oxide layer is increased.

JP-A HEI 5-129596 discloses a process for dry oxidation and wet oxidation of a silicon substrate. From the description, this is a process that increases the gate layer thickness by using wet oxidation to oxidize a semiconductor substrate, as understood from the description, "(A) is when dry oxidation is performed for 85 minutes, making the thickness of the gate oxide layer 25.3 nm, and (B) is when, similarly, dry oxidation is performed for 80 minutes, after which wet oxidation is performed for 1 minute, making the thickness of the gate oxide layer 26.3 nm."

However, this JP-A HEI 5-129596 shows no disclosure relating to the composition of a buried channel type MIS field-effect transistor. It is known that in this type of transistor, the performance is highly dependent on the profile of the diffused impurity. Therefore, the relationship between the heat treatment in the oxidizing process and the introduction of the impurity is important. With respect to the impurity that is introduced, because the present invention uses a silicon carbide substrate having a diffusion coefficient that is lower than that of a silicon substrate, it is possible to use heat treatment for the purpose of oxidation, after forming the diffusion layer used for the buried channel, and the source/drain diffusion layer. The present invention differs from the invention of the JP-A HEI 5-129596 in that it discloses a process that allows the use of a silicon carbide substrate.

DISCLOSURE OF THE INVENTION

Compared to a silicon MIS transistor, the interfacial level density of an oxide layer-silicon oxide interface using a silicon carbide substrate generally is approximately one order of magnitude higher. Therefore, an MIS field-effect transistor that uses a silicon carbide substrate has a problem that channel mobility is approximately one order of magnitude lower than that of an MIS field-effect transistor that uses a silicon substrate. In the case of a silicon MIS transistor, it is known that a buried channel region type MIS field-effect transistor is superior because the flow of electrons from the source to the drain is not readily affected by the above interface between oxide layer and silicon carbide. But, when a silicon MIS transistor on a silicon carbide substrate is made as a buried channel region type structure that is not optimized, it readily becomes normally on (a phenomenon where current flows between source and drain even when the gate voltage is zero). Also, in cases where optimization is not attempted, hot carrier resistance is poor and adequate punch-through resistance cannot be achieved.

This invention was proposed in consideration of the above and, in a semiconductor device using a silicon carbide substrate, has as its object to provide a method of manufacturing a semiconductor device that is a buried channel region type transistor that by optimizing the structure of the burned channel region type MIS transistor, gate insulation layer formation method and surface orientation of the silicon carbide substrate, does not become normally on and, moreover, has high hot-carrier resistance, high punch-through resistance and high channel mobility.

For achieving this object, a first aspect of the present invention relates to a method of manufacturing a semiconductor device characterized by including a step of forming a buried channel region, a source region and a drain region, a step of forming a gate insulation layer after the step of forming the buried channel region, source region and drain region, and a step of exposing the gate insulation layer to an atmosphere containing water vapor at a temperature of 500° C. or more after the step of forming the gate insulation layer in a semiconductor device characterized by having a semiconductor substrate that forms a P-type silicon carbide region, a gate insulation layer formed on the P-type region, a gate electrode that exhibits P-type characteristics formed on the gate insulation layer, an N-type impurity region having an adequate impurity concentration for forming a buried channel region in a semiconductor layer below the gate insulation layer, and transistor-constituting source and drain regions each composed of an N-type impurity region formed respectively adjacent to the gate insulation layer and the gate electrode.

In order to achieve a high mobility by optimizing a formation depth of the buried channel region and improve the step of forming the gate insulation layer, in addition to the first aspect, a second aspect of the present invention is characterized by including a step of forming a buried channel region, a source region and a drain region, a step of forming a gate insulation layer after the step of forming the buried channel region, source region and drain region, and a step of exposing the gate insulation layer to an atmosphere containing water vapor at a temperature of 500° C. or more after the step of forming the gate insulation layer in the semiconductor device described in claim 1 that comprises a semiconductor device in which a ratio ($L_{bc} \div Xj$) between junction depth ($L_{bc}$) of the buried channel region from an interface between the gate insulation layer and the silicon carbide region, and depth (Xj) of a junction portion of the source and drain regions from the interface between the gate insulation layer and the silicon carbide region is within a range of not less than 0.2 and not more than 1.0.

In addition to the first or second aspect, a third aspect of the present invention is characterized by including a step of forming a buried channel region and a source region and a drain region, a step of forming a gate insulation layer after the step of forming the buried channel region, source region and drain region, and a step of exposing the gate insulation layer to an atmosphere containing water vapor at a temperature of 500° C. or more after the step of forming the gate insulation layer in the semiconductor device that is polycrystalline silicon in which boron is diffused and which has an impurity concentration within a range of $1 \times 10^{16}$ cm$^{-3}$ to $1 \times 10^{21}$ cm$^{-3}$.

In addition to the first or second aspect, a fourth aspect of the present invention that relates to a buried channel region is characterized by including a step of forming the buried channel region a source region and a drain region, a step of forming a gate insulation layer after the step of forming the buried channel region, source region and drain region, and a step of exposing the gate insulation layer to an atmosphere containing water vapor at a temperature of 500° C. or more after the step of forming the gate insulation layer in the semiconductor device in which the buried channel region has diffused therein a nitrogen, phosphorus or arsenic impurity having a maximum concentration of $5 \times 10^{15}$ cm$^{-3}$ to $1 \times 10^{18}$ cm$^{-3}$.

In addition to any of the above first to fourth aspects, a fifth aspect of the present invention that relates to lowering resistance of a gate electrode is characterized by including a step of forming a buried channel region, a source region and a drain region, a step of forming a gate insulation layer after the step of forming the buried channel region, source region and drain region, and a step of exposing the gate insulation layer to an atmosphere containing water vapor at a temperature of 500° C. or more after the step of forming the gate insulation layer in the semiconductor device in which the gate electrode includes a high-melting-point metal silicide layer.

In addition to the fifth aspect, a sixth aspect of the present invention is characterized by including a step of forming a buried channel region, a source region and a drain region, a step of forming a gate insulation layer after the step of forming the buried channel region, source region and drain region, and a step of exposing the gate insulation layer to an atmosphere containing water vapor at a temperature of 500° C. or more after the step of forming the gate insulation layer in the semiconductor device in which the high-melting-point metal silicide layer is a tungsten, molybdenum or titanium silicide layer.

In addition to any of the above first to sixth aspects, a seventh aspect of the present invention that relates to a hot-carrier resistance improvement technology is characterized by including a step of forming a buried channel region, a source region and a drain region, a step of forming a gate insulation layer after the step of forming the buried channel region, source region and drain region, and a step of exposing the gate insulation layer to an atmosphere containing water vapor at a temperature of 500° C. or more after the step of forming the gate insulation layer in the semiconductor device that has a region between a region in which the buried channel region is formed and the source or drain region having an impurity concentration that is not lower than a maximum impurity concentration of an impurity diffusion layer region used to form the buried channel region, and not higher than an impurity concentration of the source or drain region.

In addition to the above seventh aspect, an eighth aspect of the present invention that relates to a hot-carrier resistance improvement technology is characterized by including a step of forming a buried channel region, a source region and a drain region, a step of forming a gate insulation layer after the step of forming the buried channel region, source region and drain region, and a step of exposing the gate insulation layer to an atmosphere containing water vapor at a temperature of 500° C. or more after the step of forming the gate insulation layer in the semiconductor device that includes between a region in which the buried channel is formed and the source or drain region, a diffusion layer of nitrogen, phosphorus or arsenic at a maximum concentration that is $5 \times 10^{16}$ cm$^{-3}$ to $5 \times 10^{19}$ cm$^{-3}$.

In addition to any of the above first to eighth aspects, a ninth aspect of the present invention that relates to punch-through resistance improvement is characterized by including a step of forming a buried channel region, a source region and a drain region, a step of forming a gate insulation layer after the step of forming the buried channel region, source region and drain region, and a step of exposing the gate insulation layer to an atmosphere containing water vapor at a temperature of 500° C. or more after the step of forming the gate insulation layer in the semiconductor device in which, located adjacently beneath the region in which the buried channel is formed, there is a P-type impurity diffusion region having an impurity concentration that is higher than an impurity concentration of the semiconductor substrate.

In addition to the ninth aspect, a tenth aspect of the present invention is characterized by including a step of forming a buried channel region a source region and a drain region, a step of forming a gate insulation layer after the step of forming the buried channel region, source region and drain region, and a step of exposing the gate insulation layer to an atmosphere containing water vapor at a temperature of 500° C. or more after the step of forming the gate insulation layer in a semiconductor device having a high-concentration P-type impurity diffusion region located adjacently beneath the region in which the buried channel is formed that includes an aluminum or boron diffusion layer having a maximum impurity concentration of $1 \times 10^{17}$ cm$^{-3}$ to $1 \times 10^{19}$ cm$^{-3}$.

An eleventh aspect of the present invention relates to channel mobility improvement in a method of manufacturing a semiconductor device characterized by any of the first to tenth aspects, characterized by the gate insulation layer being formed by a thermal oxidation method using dry oxygen.

BEST MODE FOR CARRYING OUT THE INVENTION

In the following, details of the modes of this invention are described with reference to the following examples.

EXAMPLE 1

Figure 1:
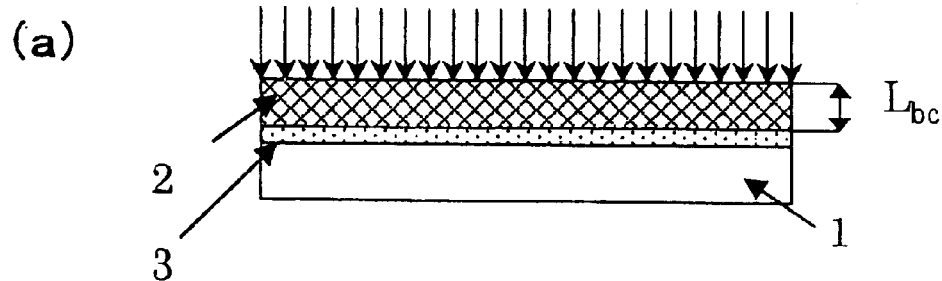
FIG. 1 is a diagram showing stages in a preferred process for manufacturing an MIS field-effect transistor having a P-type gate electrode and a buried channel region.
Figure 1:
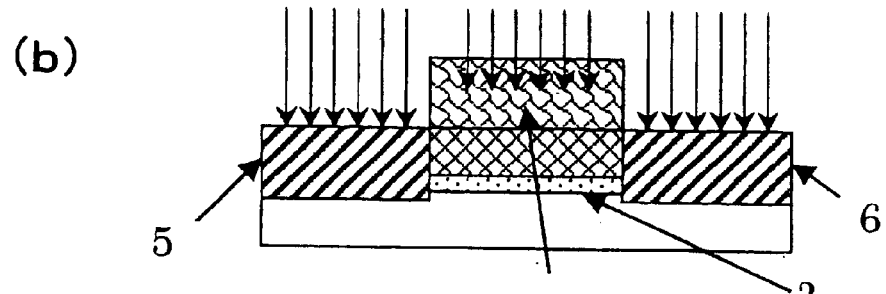
Figure 1:
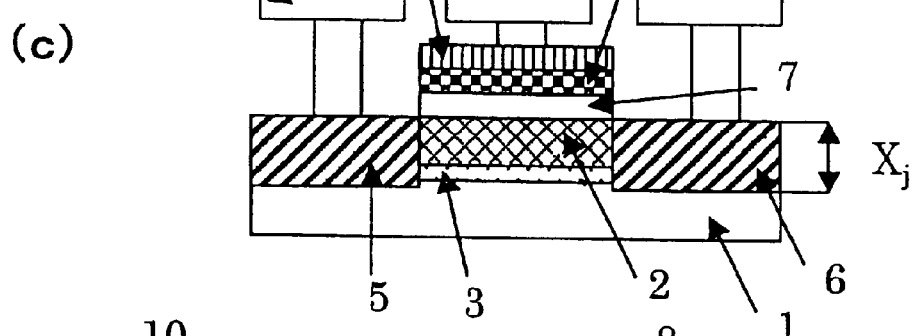
Figure 1:
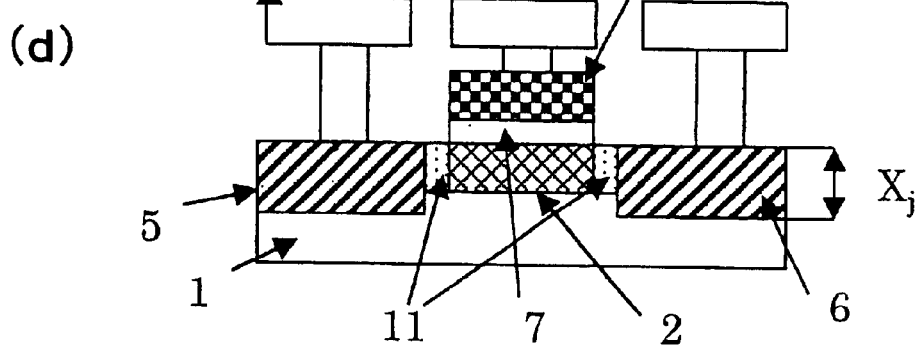

First, as an example of a preferred manufacturing process of this invention, Example 1 is shown in FIGS. 1(a), 1(b) and 1(c), and will be explained in order, with the experiments conducted to obtain the data of FIG. 2 through FIG. 5.

After a P-type silicon carbide substrate 1 (4H-SiC, impurity concentration: $5\times10^{15}$ cm$^{-3}$) shown in FIG. 1(a) has been subjected to ordinary RCA cleaning, RIE (reactive ion etching) is used to form photolithography alignment marks on the P-type silicon carbide substrate 1. Next, in order to investigate the punch-through resistance improvement effect, a number of samples were prepared by using aluminum ion implantation to form a punch-through prevention region 3 at a depth that placed the region just below a buried channel region; the punch-through prevention region 3 was given a higher impurity concentration of $1\times10^{16}$ cm$^{-3}$ to $1\times10^{19}$ cm$^{-3}$ than that of the P-type silicon carbide substrate 1.

Next, ion implantation of an N-type impurity, such as nitrogen, phosphorus or arsenic, is used to form the buried channel region 2. If phosphorus, for example, is used to form a buried channel region at a junction depth ($L_{bc}$) of 0.3 $\mu$m, the desired profile is formed using multiple implantations at 40 to 250 keV to provide a total dose to achieve a concentration of $7\times10^{16}$ cm$^{-3}$. With the manufacturing process shown in this example, to investigate the relationship between the ratio between $L_{bc}$ and the depth (Xj) of a source 5 and drain 6 shown in FIG. 1(b), and the channel mobility, a buried channel region 2 was formed at a depth ($L_{bc}$) of 0.1, 0.2, 0.3, 0.4 and 0.5 $\mu$m. To investigate the concentration dependency of the buried channel region 2 with respect to channel mobility, ion implantation was used to prepare samples having concentrations of $5\times10^{15}$ cm$^{-3}$ to $5\times10^{17}$ cm$^{-3}$ at an $L_{bc}$ of 0.3 $\mu$m.

Next, thermal oxidation or CVD (chemical vapor deposition) is used to form a $SiO_2$ layer for an ion implantation mask 4 for the source region and drain region, as shown in FIG. 1(b). In this example, as shown in FIG. 1(b), an LTO (low-temperature oxide) layer is used for the implantation mask. By reacting silane and oxygen at 400° C. to 800° C. to form silicon dioxide deposited on the P-type silicon carbide substrate 1, thereby forming the LTO layer. Then, after using lithography to form the source and drain regions, HF (hydrofluoric acid) is used to etch the LTO and expose the ion implantation source and drain regions. Next, to form the source 5 and drain 6 shown in FIG. 1(b), ion implantation at 500° C. is used to implant nitrogen, phosphorus or arsenic at a depth (Xj) of 0.5 $\mu$m. In this example, as in the case of the formation of the buried channel region 2, multiple implantation steps are used to form a phosphorus concentration of $5\times10^{19}$ cm$^{-3}$.

This is followed by activation annealing for 30 minutes at 1500° C. in an argon atmosphere. This is followed by oxidation at 1200° C. for approximately 150 minutes in a gas containing $O_2$ or for approximately 90 minutes in a gas containing water vapor, to form a gate insulation layer 7 approximately 50 nm thick. The following methods are known for oxidation using a gas containing water vapor.

1) Using oxygen or inert gas (argon, nitrogen or helium) to flow water vapor heated to steam up to the silicon carbide substrate.
2) Combusting $H_2$ and $O_2$ at 900° C. to generate steam that is flowed up to the silicon carbide substrate. In this case too, water vapor can be flowed together with inert gas.

While either method can be used, here method 2) is used. Next, after being annealed for 30 minutes in an argon atmosphere, the samples were cooled in argon to room temperature. This step can be omitted. Also, to investigate the effect of the heat treatment in an atmosphere containing water vapor, some of the samples were heat-treated at 950° C. for 3 hours by combusting $H_2$ and $O_2$ at 800° C. to generate steam that was flowed up to the silicon carbide substrate. Here too, water vapor can be flowed together with inert gas.

After that, a P-type gate electrode 8 is formed. There are a number of methods for doing this, as shown below.

1) P-type polycrystalline silicon is formed using the CVD method to form polycrystalline silicon, followed by boron or boron fluoride ion implantation.
2) P-type polycrystalline silicon is formed using the CVD method to form polycrystalline silicon, followed by the formation of a boron-containing $SiO_2$ film by the CVD method or by spin-coating, and using heat treatment at 800° C. to 1100° C. to effect diffusion.
3) P-type polycrystalline silicon is formed flowing silane and diborane together and heat-treating at 600° C. to grow the polycrystalline silicon while diffusing boron.

In this example, method 2) is used. Here, the diffusion time was changed at 900° C. to form P-type polycrystalline silicon with an impurity concentration of $1\times10^{15}$ cm$^{-3}$ to $1\times10^{21}$ cm$^{-3}$, and the relationship between the impurity concentration of the P-type gate electrode and the channel mobility was investigated. To investigate the effect of the silicide film, using a number of samples, high-melting-point metal silicide layers 9 of $WSi_2$, $MoSi_2$ and $TiSi_2$ were formed on the P-type polycrystalline silicon. The P-type polycrystalline silicon or the composite silicide and P-type polycrystalline silicon layer and the gate insulation layer were then etched to form the gate electrode. Following this, the oxide film over the source and drain regions was then etched to form contact holes. Then, vapor deposition or sputtering was used to form a metal-containing layer or laminated layer of nickel, titanium or aluminum, and RIE or wet etching was used to form metal wires 10. In this example, vapor deposition of nickel was used, followed by wet etching. To ensure good ohmic contact, the samples were then heat-treated for 5 minutes at 1000° C. in an argon atmosphere, thereby completing the MIS field-effect transistors.

Table 1 shows a comparison of the effect of the gate oxidation method, post-oxidation heat treatment and buried channel structure on the channel mobility of a MOSFET according to the above process.

TABLE 1

| Gate oxidation method | Ordinary MOSFET | | Buried channel MOSFET | |
|---|---|---|---|---|
| | Argon treatment | Treatment after water vapor | Argon treatment | Treatment after water vapor |
| Dry oxidation | 10 $cm^2/Vs$ | 25 $cm^2/Vs$ | Normally on | 140 $cm^2/Vs$ |
| Wet oxidation | 10 $cm^2/Vs$ | 15 $cm^2/Vs$ | 50 $cm^2/Vs$ | 125 $cm^2/Vs$ |

In each case, the process shown was under the following conditions.
1) Dry oxidation: Oxidizing for 150 minutes at 1200° C. using only oxygen containing no water vapor.
2) Wet oxidation: Combusting $H_2$ and $O_2$ at 900° C. to generate water vapor that is flowed up to the substrate, oxidizing for 90 minutes at 1200° C.
3) Argon treatment: Following formation of oxide film, 30 minutes of heat treatment at 1200° C. in argon, and cooling treatment.
4) Treatment after water vapor: Following argon treatment, combusting $H_2$ and $O_2$ at 800° C. to generate water vapor that is flowed up to the silicon carbide substrate, heat-treating for 3 hours at 950° C., then cooling to room temperature.

From Table 1, it can be understood that in the case of an ordinary MOSFET, by just using argon heat treatment after forming the gate insulation layer, channel mobility is the same with respect to both dry oxidation and wet oxidation (both being 10 $cm^2/Vs$), but when heat treatment in a water vapor atmosphere is also used, channel mobility is 25 $cm^2/Vs$ in the case of dry oxidation and 15 $cm^2/Vs$ in the case of wet oxidation, so channel mobility is improved by using water vapor treatment after gate layer formation.

Moreover, channel mobility is higher when dry oxidation is used to form the gate oxidation layer. This is the same in the case of a buried channel structure MOSFET. Gate oxidation by dry oxidation using just argon heat treatment resulted in a normally on condition, making the device unusable in practice, but forming the gate insulation layer by water vapor oxidation resulted in a channel mobility that, at 50 $cm^2/Vs$, was improved by the buried channel structure.

Furthermore, when water vapor treatment is used after gate insulation layer formation, in the case of gate insulation layer formation by dry oxidation channel mobility is 140 $cm^2/Vs$ and 125 $cm^2/Vs$ in the case of water vapor oxidation, showing that a combination of buried channel structure and post-oxidation water vapor treatment produces a major improvement in channel mobility. In particular, channel mobility became highest when the gate insulation layer was formed using dry oxidation.

Using water vapor treatment after gate insulation layer formation increased the thickness of the gate insulation layer very slightly (by around 0.1 to 0.5 nm), but in calculating the channel mobility, it was assumed that there was no change in the gate insulation layer thickness. Therefore, in practice, it can be understood that the difference in channel mobility is very slightly larger than the above values.

Viewing the time of the water vapor treatment following gate insulation layer formation as a function, channel mobility improves as the water vapor treatment time is increased from 0 (zero). However, when water vapor treatment was carried out over an extended time, channel mobility showed a tendency to decrease. Therefore, the above water vapor treatment is effective up to a time (critical time) at which channel mobility is exhibited that is below the channel mobility when water vapor treatment is not used. However, because this critical time varies depending on substrate impurity concentration and the like, it cannot be uniformly specified. Also, it can be readily understood that there is an optimum time at which maximum channel mobility is reached. It is desirable for the time of the water vapor treatment of the present invention to be carried out in this optimum time.

Figure 2:
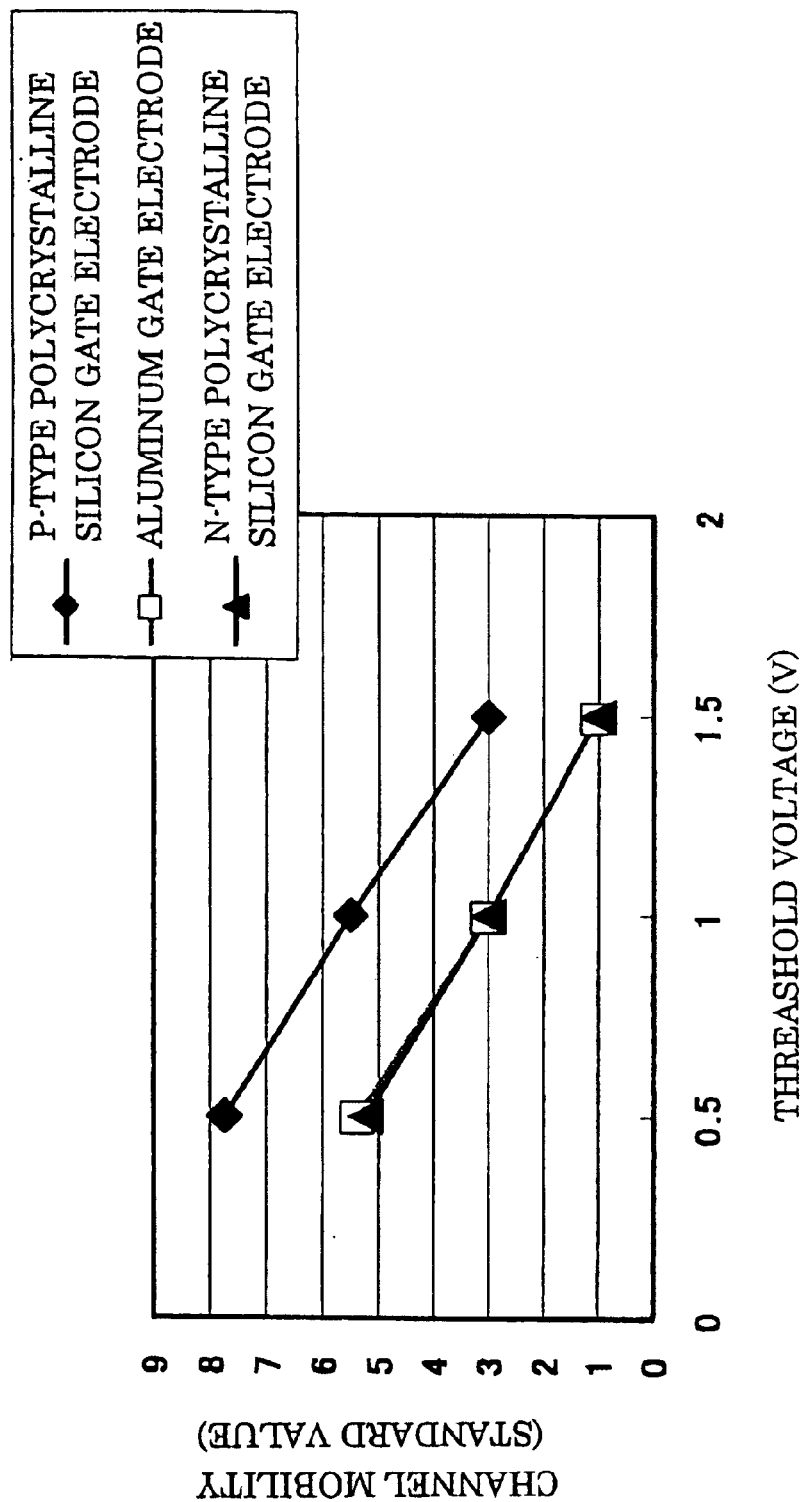
FIG. 2 is a diagram showing the relationship between channel mobility and threshold voltage in an MIS field-effect transistor with a gate electrode of P-type polycrystalline silicon, N-type polycrystalline silicon, and aluminum, in which $L_{bc}=0.3\,\mu m$, $Xj=0.5\,\mu m$, the impurity concentration of the buried channel region is $2\times10^{16}$ cm$^{-3}$, and the impurity concentration of the P-type polycrystalline silicon is $5\times10^{20}$ cm$^{-3}$.

FIG. 2 shows the measurement-based relationship between channel mobility and threshold voltage in a MIS field-effect transistor with a gate electrode using P-type polycrystalline silicon, N-type polycrystalline silicon and aluminum. Compared using the same threshold voltage, channel mobility is higher with a gate electrode that uses P-type polycrystalline silicon than that of a gate electrode that uses N-type polycrystalline silicon or aluminum. This is due to the fact that, depending on the gate electrode polarity, a different amount of ion implantation is required to achieve the same threshold voltage; possible reasons are detailed below.

Implantation of N-type impurity into the buried channel region 2 results in the center of the channel being formed at a deep location away from the interface between the gate insulation layer and the P-type silicon carbide substrate 1. Since this increases the number of carriers that are not readily susceptible to the effect of the high field near the interface, channel mobility is increased. Mobility is also increased by a low channel concentration of implanted P-type impurity. However, if the N-type impurity in the buried channel region 2 is increased to increase the channel mobility, the threshold voltage decreases, becoming a negative voltage, creating a state in which current flows even at a zero voltage, that is, a normally on state.

It is known that, in general, the threshold voltage of the MIS field-effect transistor becomes larger as the work function differential between a gate electrode and a semiconductor becomes larger. With reference to the work function differential between the gate electrode and the semiconductor, it is also known that there is almost no change when aluminum or N-type polycrystalline silicon is used for the gate electrode, but when P-type polycrystalline silicon is used, compared to the semiconductor substrate, it becomes approximately one volt more. Therefore, even when N-type impurity is implanted in the channel region, the tendency for the threshold voltage to go negative and create a normally on state can be suppressed by using P-type polycrystalline silicon for the gate electrode, so that even with the same threshold voltage, channel mobility can be increased by implanting an impurity concentration for forming the buried channel region that is higher compared to aluminum and N-type polycrystalline silicon used for the gate electrode. This makes it possible to form a channel at a deeper location, therefore making it possible to increase the channel mobility.

Figure 3:
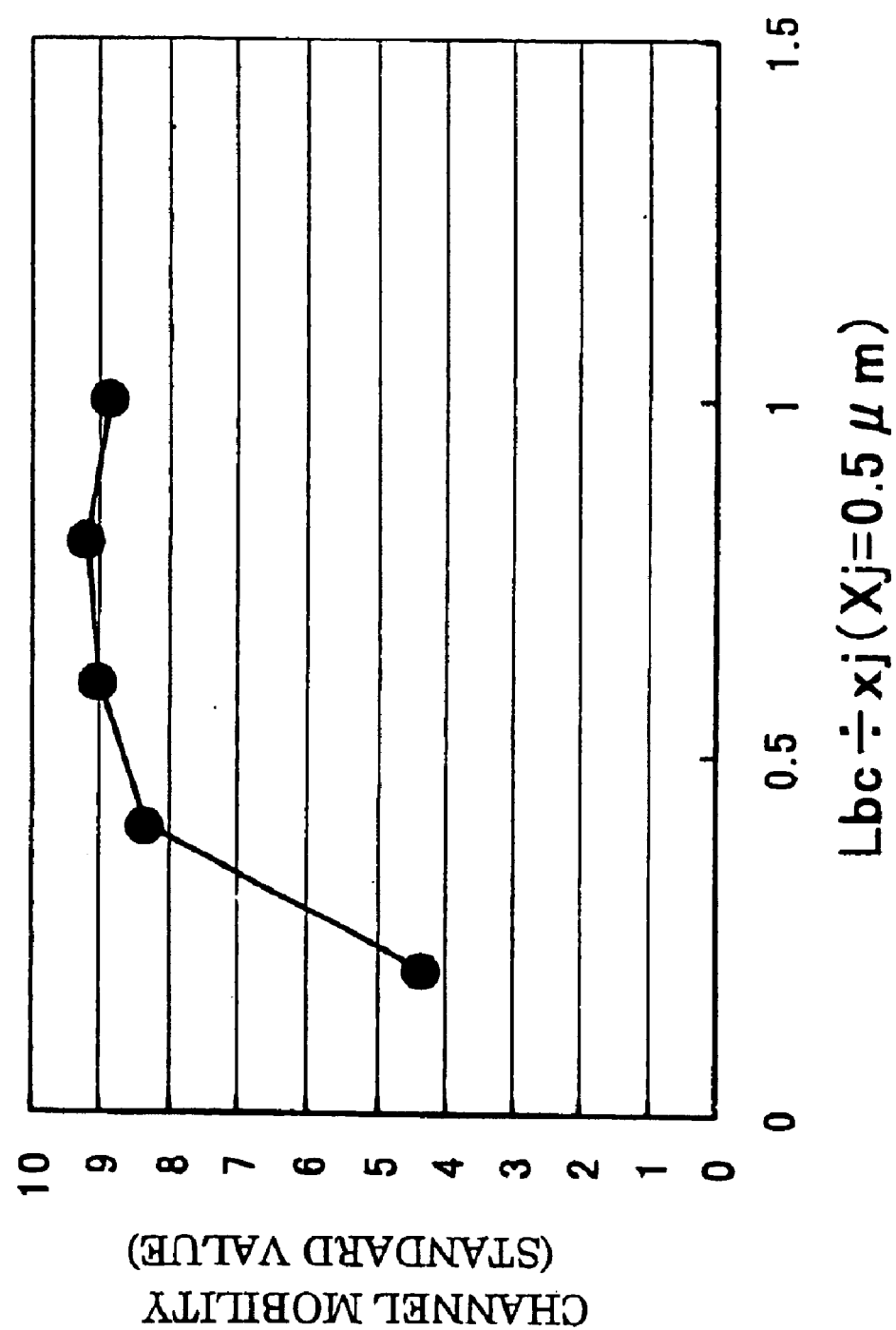
FIG. 3 is a diagram showing the $L_{bc} \div Xj$ dependency of the channel mobility of a buried channel in a P-type polycrystalline silicon gate electrode, in which the impurity concentration is $5\times10^{20}$ cm$^{-3}$, $L_{bc}=0.3\,\mu m$, $Xj=0.5\,\mu m$, and the impurity concentration of the buried channel region is $2\times10^{16}$ cm$^{-3}$.

FIG. 3 is a graph showing the $L_{bc} \div Xj$ dependency of the channel mobility, when the junction depth Xj of the source and drain diffusion layers is 0.5 μm. In FIG. 3, the vertical axis shows the normalized channel mobility of a sample having no buried channel region. The evaluation was performed using an $L_{bc}$ of 0.2 or more; it was confirmed that there was an effect even at 0.2. Therefore, the lower limit on the horizontal axis was set at 0.2. At over 1 on the horizontal axis, channel mobility increases, but the threshold voltage goes negative, resulting in a normally on state that makes the device difficult to use in practice. Therefore, the horizontal axis is limited to 0.2 to 1.0. A range of 0.4 to 1.0 is particularly effective.

Figure 4:
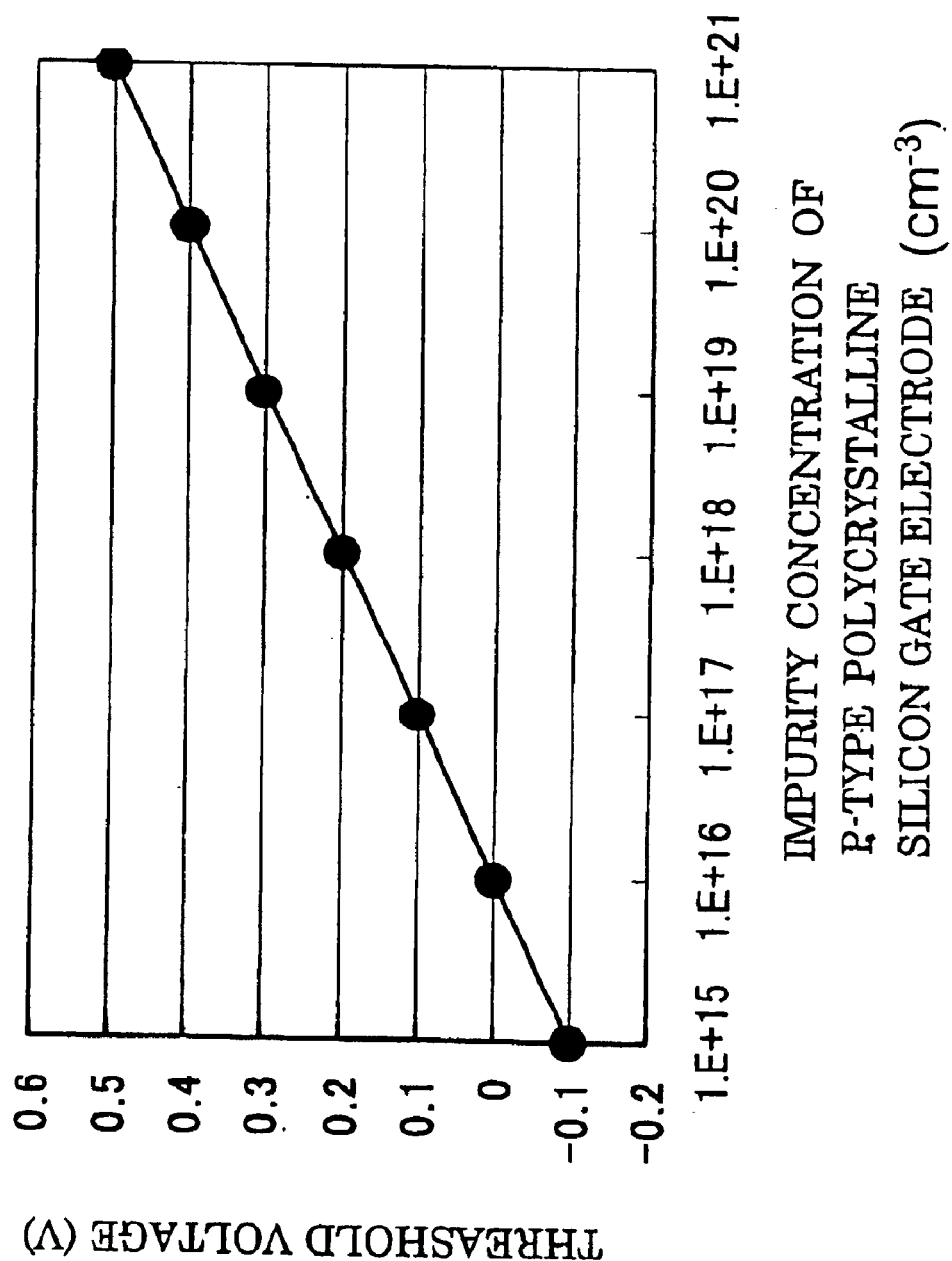
FIG. 4 is a diagram showing the relationship between the impurity concentration of the P-type polycrystalline silicon gate and the threshold voltage, in which $L_{bc}=0.3\,\mu m$, $Xj=0.5\,\mu m$, and the impurity concentration of the P-type polycrystalline silicon is $2\times10^{19}$ cm$^{-3}$.

FIG. 4 shows the measured relationship between the impurity concentration of the P-type polycrystalline silicon gate and the threshold voltage. A higher concentration increases the work function differential between the gate electrode and the semiconductor substrate, increasing the threshold voltage. Conversely, a lower concentration decreases the threshold voltage, which at $1 \times 10^{16}$ cm$^{-3}$ becomes zero. Therefore the lower limit for the impurity concentration is set at $1 \times 10^{16}$ cm$^{-3}$, and since the concentration of boron capable of being implanted into polycrystalline silicon is $1 \times 10^{21}$ cm$^{-3}$, the upper limit is set at $1 \times 10^{21}$ cm$^{-3}$.

Figure 5:
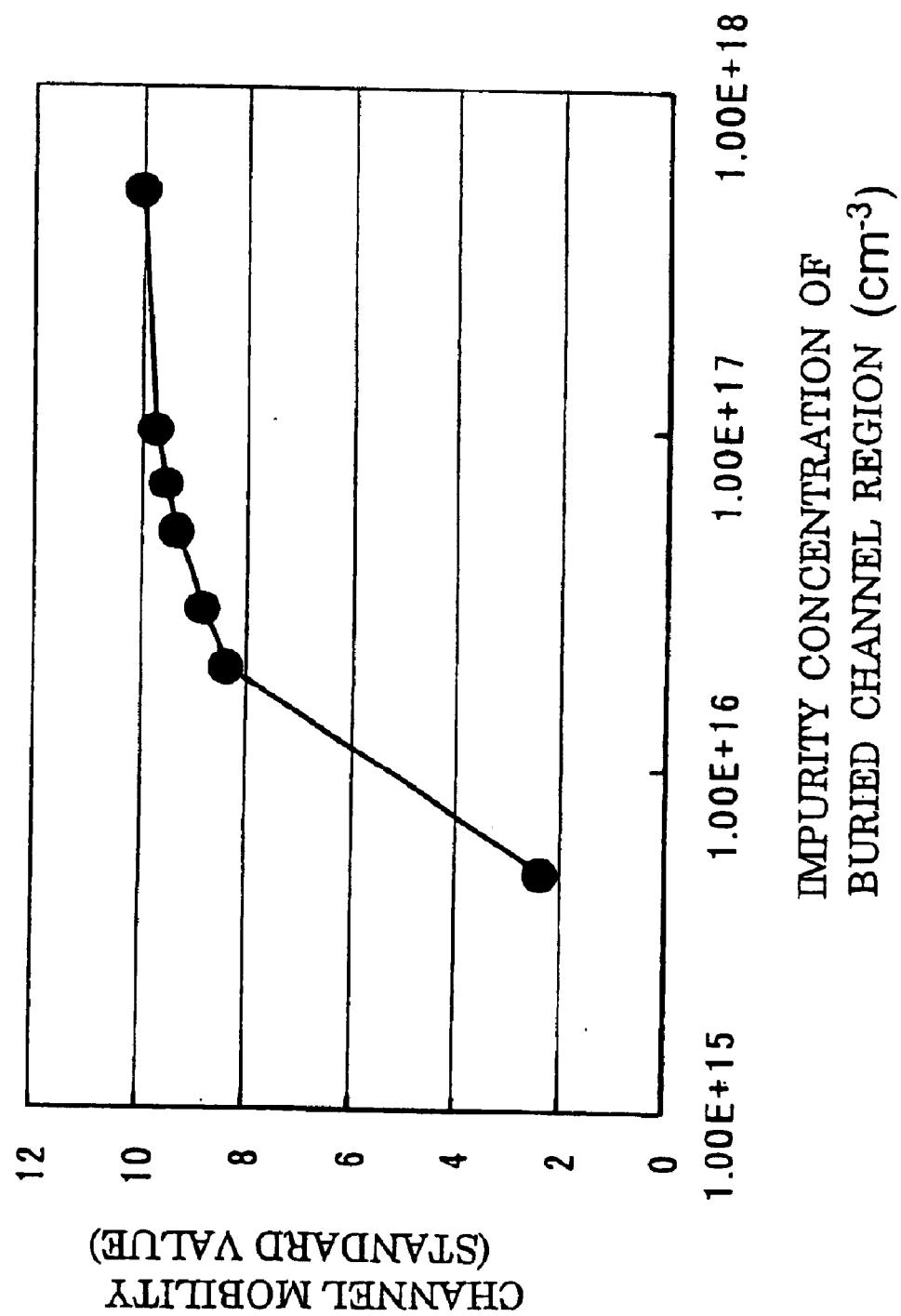
FIG. 5 is a diagram showing the relationship between channel mobility and the impurity concentration of the buried channel region, in which $L_{bc}=0.3\,\mu m$, $Xj=0.5\,\mu m$, and the impurity concentration of the P-type polycrystalline silicon is $5\times10^{20}$ cm$^{-3}$.

FIG. 5 shows the measured relationship between channel mobility (using the value at an impurity concentration of zero as the standard value) and the impurity concentration of the buried channel region 2. The lower limit of the evaluation impurity concentration was $5 \times 10^{15}$ cm$^{-3}$. Since an adequate effect was achieved with that value, the lower limit was set at $5 \times 10^{15}$ cm$^{-3}$. With a concentration of $1 \times 10^{18}$ cm$^{-3}$ or more, the threshold voltage goes negative, making the device hard to use, so the upper limit was set at $1 \times 10^{18}$ cm$^{-3}$.

If the impurity concentration of the P+ punch-through prevention region provided under the buried channel region 2 to suppress punch-through is lower than $1 \times 10^{17}$ cm$^{-3}$, the gate voltage that gives rise to punch-through is the same as when there is no P+ region, which is the same as no effect. A concentration of at least $1 \times 10^{17}$ cm$^{-3}$ increases the gate voltage at which punch-through occurs, so the lower limit is $1 \times 10^{17}$ cm$^{-3}$. If the impurity concentration is $1 \times 10^{19}$ cm$^{-3}$ or higher, the impurity diffuses during activation annealing, offsetting the N-type impurity in the channel region above, making it impossible for the buried channel region to function as required. Therefore, the upper limit is $1 \times 10^{19}$ cm$^{-3}$.

The specific resistance of polycrystalline silicon given a high boron concentration is on the milliωcm level, but the specific resistances of the high-melting-point metal silicides, for example $MoSi_2$, $WSi_2$ and $TiSi_2$ are 60 μωcm, 50 μωcm and 15 μωcm, respectively, so the specific resistance of a gate electrode that is a composite of polycrystalline silicon and silicide is lower compared to polycrystalline silicon in which impurity has been implanted. As such, it can be readily understood that even when P-type polysilicon is used, from the standpoint of configuring a circuit, it is more advantageous to use a polycide structure that is a laminated layer of polycrystalline silicon and silicide. When a polycide structure is thus used, the threshold value becomes substantially equal to what it is when only P-type polysilicon is used, so the channel mobility also becomes substantially the same in this case.

EXAMPLE 2

An example that differs from the above example will now be described as Example 2. FIGS. 1(a), 1(b) and 1(d) show the order of a specific manufacturing process of Example 2.

After a P-type silicon carbide substrate 1 (impurity concentration: $5 \times 10^{15}$ cm$^{-3}$) shown in FIG. 1(a) was subjected to ordinary RCA cleaning, RIE (reactive ion etching) was used to form photolithography alignment marks on the P-type silicon carbide substrate 1. Next, phosphorus ion implantation was used to form a buried channel region 2 at a junction depth $L_{bc}$ of 0.3 μm, using multiple implantations at 500° C. and 40 keV to 250 keV to provide a total dose for a concentration of $7 \times 10^{15}$ cm$^{-3}$. Then, as shown in FIG. 1(b), to form an ion implantation mask, an LTO layer was formed over the whole surface and photolithography was used to leave the gate electrode portion resist, with hydrofluoric acid being used to etch the LTO layer. Then, to investigate the hot-carrier resistance effect of the impurity concentration between the buried channel region 2 and the source 5 or drain 6, ion implantation of phosphorus at 500° C. was used to form a low-impurity-concentration region 11 having an impurity concentration of $5 \times 10^{16}$ cm$^{-3}$ to $5 \times 10^{20}$ cm$^{-3}$ between the buried channel region 2 of FIG. 1(d) and the source 5 or drain 6. Next, to form the source region 5 and drain region 6, an LTO layer was formed over the whole surface and photolithography used to form a photoresist to define the source and drain regions, and HF (hydrofluoric acid) was used to etch the LTO layer and expose the ion implantation source and drain regions. The source 5 and drain 6 were then formed using multiple ion implantations of phosphorus at 500° C. to form an impurity concentration of $5 \times 10^{19}$ cm$^{-3}$. This was followed by activation annealing for 30 minutes at 1500° C. in an argon atmosphere.

For each sample, this was followed by dry oxidation at 1200° C. for 150 minutes, forming a gate insulation layer 7 approximately 50 nm thick. After being annealed for 30 minutes in an argon atmosphere, the samples were cooled in argon to room temperature. Samples were also fabricated that were heat treated at 950° C. for 3 hours in a water vapor atmosphere, annealed for 30 minutes in argon, then cooled to room temperature in argon. The P-type gate electrode 8 was then formed by using the CVD method to form polycrystalline silicon, and by using spin coating to form a boron-containing oxide film on the polycrystalline silicon followed by 30 minutes of heat treatment at 900° C. to diffuse boron from the boron-containing oxide film to the polysilicon. The P-type polycrystalline silicon and the gate insulation layer were then etched to form the gate electrode. Next, LTO was deposited over the whole surface of the oxide layer and the oxide film over the source 5 and drain 6 was etched to form contact holes. The electron-beam deposition method was then used to form a nickel film over-the layer, and wet etching was used to form metal wires 10. To form a good ohmic contact, the samples were then heat-treated for 5 minutes at 1000° C. in an argon atmosphere, thereby completing the MIS field-effect transistors.

The transistors were subjected to an electrical stress for a set time, and the degree by which the threshold voltage changed was measured to evaluate hot-carrier resistance. A smaller change in threshold voltage indicated good hot-carrier resistance. The threshold voltage was obtained as the voltage at which, with 0.1 volt applied to the drain and with the source at 0 volt, along a gate voltage of zero to 30 volts, the square of half the drain current intersects the plotted voltage axis. The electrical stress comprised applying 5 volts to the drain and 2.5 volts to the gate, for five minutes. The transistors measured were those in which ion implantation of phosphorus was used to form an impurity concentration of $5 \times 10^{16}$ cm$^{-3}$ to $5 \times 10^{19}$ cm$^{-3}$ between the buried channel region 2 and the source or drain region. A low impurity concentration in this region results in a larger depletion layer owing to which a field is smaller in the vicinity of the drain, making it possible to prevent electrons that pass through the region from entering a high-energy state, thereby improving hot-carrier resistance by decreasing the number of electrons that are implanted into the gate insulation layer from the substrate by scattering. However, if the impurity concentration of this region is too low, the resistance of the region will become too high, reducing the driving force of the transistor, leading to a lower limit of $5 \times 10^{16}$ cm$^{-3}$. If the concentration is too high, the field in the vicinity of the drain will not be alleviated, making it impossible to attain sufficient hot-carrier resistance. From measurements, it was found that with a concentration of $5 \times 10^{19}$ cm$^{-3}$ or more, the amount of change in threshold voltage exceeded 10%. That much change is too much for practical use. Therefore, the upper limit became $5 \times 10^{19}$ cm$^{-3}$.

While the foregoing description has been made with reference to the use of silicon carbide, it can be readily understood that the effect will be the same with a semiconductor substrate using diamond, silicon, gallium nitride or other such semiconductor.

INDUSTRIAL APPLICABILITY

This invention constituted as described in the foregoing has the applicability described below.

The first aspect of the present invention is a method of manufacturing a semiconductor device using a P-type gate electrode that includes heat treatment in an atmosphere containing water vapor, following gate insulation layer formation. This makes it possible to use a relatively high N concentration without the device becoming normally on, making it possible to increase channel mobility.

In the second aspect of the present invention, the ratio between the junction depth Xj of the source and drain regions and the junction depth $L_{bc}$ of the buried channel region junction is optimized, and after its formation the gate insulation layer is heat-treated in an atmosphere containing water vapor, which enables the channel mobility to be improved.

In addition to the first or second aspect, in a third aspect of the present invention, the concentration of the P-type polycrystalline silicon is optimized, and after its formation the gate insulation layer is heat-treated in an atmosphere containing water vapor, which enables the channel mobility to be improved.

In addition to the first or second aspect, in a fourth aspect of the present invention, the concentration of the buried channel region is optimized, and after its formation the gate insulation layer is heat-treated in an atmosphere containing water vapor, which enables the channel mobility to be improved.

In addition to any of the first to fourth aspects, in a fifth aspect of the present invention, the gate electrode resistance value is lowered by overlaying a high-melting-point metal silicide layer on the P-type polycrystalline silicon, and, following its formation, heat-treating the gate insulation layer in an atmosphere containing water vapor, which enables the driving power to be improved.

In addition to the fifth aspect, a sixth aspect of the present invention uses a tungsten, molybdenum or titanium silicide layer, and also, following its formation, heat-treats the gate insulation layer in an atmosphere containing water vapor, which enables the operating speed of the semiconductor device to be improved.

In addition to any of the first to sixth aspects, seventh and eighth aspects of the present invention improve both hot-carrier resistance and driving power by providing a region between the buried channel region and the source or drain region having an impurity concentration that is not lower than the impurity concentration of the buried channel region, and not higher than the impurity concentration of the source or drain region, and by, after formation of the gate insulation layer, heat-treating the gate insulation layer in an atmosphere containing water vapor.

In addition to any of the first to eighth aspects, ninth and tenth aspects of the present invention improve both punch-through resistance and driving power by providing adjacently beneath the buried channel region, an impurity region of the P-type semiconductor substrate 1 or by optimizing the concentration thereof, and, at the same time, by, following formation of the gate insulation layer, heat-treating the gate insulation layer in an atmosphere containing water vapor.

In addition to any of the first to tenth aspects, an eleventh aspect of the present invention relates to a method of manufacturing a semiconductor device in which channel mobility can be improved by forming the gate insulation layer by using a thermal oxidation method employing dry oxygen followed by heat treatment in an atmosphere containing vapor.

What is claimed is:

1. A method of manufacturing a semiconductor device, said semiconductor including a semiconductor substrate that forms a P-type silicon carbide region, a gate insulation layer formed on the P-type region, a gate electrode that exhibits P-type characteristics formed on the gate insulation layer, an N-type impurity region having an adequate impurity concentration for forming a buried channel region in a semiconductor layer below the gate insulation layer, and transistor-constituting source and drain regions each composed of an N-type impurity region formed respectively adjacent to said gate insulation layer and said gate electrode;

said method comprising:
forming the buried channel region, source region, and drain region;
forming the gate insulation layer; and
exposing the gate insulation layer to an atmosphere containing water vapor at a temperature of 500° C. or more.

2. The method according to claim 1, wherein the semiconductor device has a ratio ($L_{bc} \div Xj$) between junction depth ($L_{bc}$) of the buried channel region from an interface between the gate insulation layer and the P-type silicon carbide region, and depth (Xj) of a junction portion of the source and drain regions from said interface, which ratio is within a range of not less than 0.2 and not more than 1.0.

3. The method according to claim 1, wherein the gate electrode is polycrystalline silicon in which boron is diffused and which has an impurity concentration within a range of $1 \times 10^{16}$ cm$^{-3}$ to $1 \times 10^{21}$ cm$^{-3}$.

4. The method according to claim 1, wherein the buried channel region has diffused therein a nitrogen, phosphorus, or arsenic impurity having a maximum concentration of $5 \times 10^{15}$ cm$^{-3}$ to $1 \times 10^{15}$ cm$^{-3}$.

5. The method according to claim 1, wherein said gate electrode includes a high melting point metal silicide layer.

6. The method according to claim 1, wherein said semiconductor device has a region between a region in which the buried channel region is formed and the source or drain region having an impurity concentration that is not lower than a maximum impurity concentration of an impurity diffusion layer region used to form the buried channel region, and not higher than an impurity concentration of the source or drain region.

7. The method according to claim 1, wherein a P-type impurity diffusion region having an impurity concentration higher than an impurity concentration of the semiconductor substrate is located adjacently beneath a region in which the buried channel is formed.

8. The method according to claim 1, wherein the gate insulation layer is formed by a thermal oxidation method using dry oxygen.

9. The method according to claim 2, wherein the gate electrode is polycrystalline silicon in which boron is diffused and which has an impurity concentration within a range of $1 \times 10^{11}$ cm$^{-3}$ to $1 \times 10^{21}$ cm$^{-3}$.

10. The method according to claim 2, wherein the buried channel region has diffused therein a nitrogen, phosphorus or arsenic impurity having a maximum concentration of $5 \times 10^{15}$ cm$^{-3}$ to $1 \times 10^{18}$ cm$^{-3}$.

11. The method according to claim 2, wherein said gate electrode includes a high melting point metal silicide layer.

12. The method according to claim 2, wherein said semiconductor device has a region between a region in which the buried channel region is formed and the source or drain region having an impurity concentration that is not lower than a maximum impurity concentration of an impurity diffusion layer region used to form the buried channel region, and not higher than an impurity concentration of the source or drain region.

13. The method according to claim 2, wherein a P-type impurity diffusion region having an impurity concentration higher than an impurity concentration of the semiconductor substrate is located adjacently beneath a region in which the buried channel is formed.

14. The method according to claim 2, wherein the gate insulation layer is formed by a thermal oxidation method using dry oxygen.

15. The method according to claim 3, wherein said gate electrode includes a high melting point metal silicide layer.

16. The method according to claim 3, wherein said semiconductor device has a region between a region in which the buried channel region is formed and the source or drain region having an impurity concentration that is not lower than a maximum impurity concentration of an impurity diffusion layer region used to form the buried channel region, and not higher than an impurity concentration of the source or drain region.

17. The method according to claim 3, wherein a P-type impurity diffusion region having an impurity concentration higher than an impurity concentration of the semiconductor substrate is located adjacently beneath a region in which the buried channel is formed.

18. The method according to claim 3, wherein the gate insulation layer is formed by a thermal oxidation method using dry oxygen.

19. The method according to claim 4, wherein the gate insulation layer is formed by a thermal oxidation method using dry oxygen.

\* \* \* \* \*